(12) United States Patent
Aoi

(10) Patent No.: US 6,194,029 B1
(45) Date of Patent: Feb. 27, 2001

(54) METHOD OF FORMING POROUS FILM AND MATERIAL FOR POROUS FILM

(75) Inventor: Nobuo Aoi, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/243,491

(22) Filed: Feb. 3, 1999

(30) Foreign Application Priority Data

Feb. 12, 1998 (JP) ................................... 10-029431

(51) Int. Cl.[7] ....................................................... B05D 3/02
(52) U.S. Cl. ........................ 427/243; 427/377; 427/397.7
(58) Field of Search ................... 427/377, 397.7, 427/243

(56) References Cited

U.S. PATENT DOCUMENTS

| | | | |
|---|---|---|---|
| 3,986,997 | * 10/1976 | Clark | 260/29.2 M |
| 5,102,695 | * 4/1992 | Guest et al. | 427/387 |
| 5,470,802 | 11/1995 | Gnade et al. | 437/238 |
| 5,488,015 | 1/1996 | Havemann et al. | 437/195 |
| 5,929,159 | * 7/1999 | Schutt et al. | 524/544 |

FOREIGN PATENT DOCUMENTS

| | | |
|---|---|---|
| 6-283864 | 10/1994 | (JP) . |
| 7-321206 | 12/1995 | (JP) . |
| 8-162450 | 6/1996 | (JP) . |
| 8-330300 | 12/1996 | (JP) . |
| 9-298241 | 11/1997 | (JP) . |

OTHER PUBLICATIONS

Nanopore Foams of High Temperature Polymers, Labadie et al., IEEE Transactions on Components, Hybrids, and Manufacturing Technology, vol. 15, No. 6, pp. 925–930 Dec., 1992.
Ultralow–dielectric–constant Foams by Crystallisation from Supercritical Solution: Application to Advanced Electronic Packaging, Ehrlich et al., Advanced Materials for Optics and Electronics, vol. 1, pp. 249–253 (1992) (no month).
Block Copolymer of 2–Methyl–2–Oxazoline with Silica Gel An Organic–Inorganic Hybrid Polymer, Chujo et al., Makromol. Chem., Macromol. Symp., 42/43, pp. 303–312 (1991) (no month).
Low Density Silica Xerogels for Low K in Dielectrics, Ackerman et al., Conference Proceedings ULSI XI, pp.29–35, 1996 Materials Research Society (no date).
CRC Handbook of Chemistry and Physics, 50th ed., The Chemical Rubber Company, p. D–120, 1969.*

* cited by examiner

Primary Examiner—Shrive Beck
Assistant Examiner—Kirsten A. Crockford
(74) Attorney, Agent, or Firm—Eric J. Robinson; Nixon & Peabody LLP

(57) ABSTRACT

An organic acid containing solution obtained by adding an organic acid having an alkyl group to a solution including silanol condensate particles is applied on a substrate so as to form a coating film. The coating film is heat treated so as to form a porous film.

11 Claims, 2 Drawing Sheets

ORGANIC ACID CONTAINING SOG FILM

ORGANIC INORGANIC HYBRIDIZATION

GELATION BY ORGANIC ACID

INCREASE OF FILM STRENGTH BY GELATION

FORMATION OF PORES BY SUBLIMATION OF ORGANIC ACID

VERY SMALL DIELECTRIC CONSTANT

METHOD OF FORMING POROUS FILM AND MATERIAL FOR POROUS FILM

BACKGROUND OF THE INVENTION

The present invention relates to a method of forming a porous film and a material for a porous film used in the method.

As conventional methods of forming a porous film, the following four methods are known: In a first method, which is disclosed in "IEEE Transactions on components, hybrids, and manufacturing technology" (Vo. 15, No. 6, p. 925 (1992)), an organic polymer film is first formed from a copolymer of an organic polymer precursor with high thermal stability and an organic polymer precursor with low thermal stability, and a portion of the organic polymer film corresponding to the organic polymer precursor with low thermal stability is decomposed by heat treating the organic polymer film, thereby forming a porous film. In a second method, which is disclosed in "Advanced materials for optics and electronics" (vol. 1, p. 249 (1992)), an organic porous film is formed by depositing an organic polymer from an organic polymer solution placed in a supercritical state attained under a high pressure. In a third method, which is disclosed in "Macromol. Chem., Macromol. Symp." (42/43, 303 (1991)), an organic polymer containing silica film is first formed from a mixed solution of a silanol sol and an organic polymer, and the organic polymer is thermally decomposed by heat treating the organic polymer containing silica film, thereby forming a porous film. In a fourth method, which is disclosed in "Conference Proceedings of Advanced Metallization and Interconnect Systems for ULSI Applications in 1995, 29", a porous film is formed by gelating a silica sol by the sol-gel processing with controlling dryness of the silica sol. The fourth method is described in detail in Japanese Laid-Open Patent Publication Nos. 7-321206 and 8-162450. In addition, a fifth method is also known, as disclosed in Japanese Laid-Open Patent Publication Nos. 6-283864 and 8-330300, in which an organic material is dispersed in a silica coating film, and the organic material included in the silica coating film is blown through photochemical or thermal decomposition, thereby forming a porous film.

However, the first method of forming a porous film, in which the organic polymer film of the copolymer of the organic polymer precursor with high thermal stability and the organic polymer precursor with low thermal stability are heat treated so as to decompose the portion corresponding to the organic polymer precursor with low thermal stability, has a problem that the heat treatment is required to be conducted for 9 hours at a temperature of 275° C.

Also, the second method of forming a porous film by depositing the organic polymer from the organic polymer solution in the supercritical state has a problem that a pressure as high as several hundreds atomospheric pressure is necessary to attain the supercritical state.

Also, in the third method of forming a porous film by forming the organic polymer containing silica film from the mixed solution of silanol sol and the organic polymer and thermally decomposing the organic polymer included therein, the heat treatment is required to be conducted for 24 hours at a temperature of 600° C. Therefore, this method is very difficult to adopt, from a practical viewpoint, in formation of an interlayer insulating film of a porous film in manufacture of a semiconductor device.

Furthermore, the fourth method of forming a porous film by gelating silica sol by the sol-gel processing with controlling the dryness of the silica sol has a problem that an aging process is required to be conducted in an atmosphere of a solvent for controlling the volatizing rate of the solvent of the silica sol.

In addition, the fifth method of forming a porous film by blowing the organic material included in the silica coating film through photochemical or thermal decomposition is disadvantageously complicated.

Accordingly, the present inventors have proposed a method of forming a porous film in Japanese Laid-Open Patent Publication No. 9-298241. In this method, a residual silanol group in silanol condensate particles is chemically modified by a silyl group by adding a silylation reagent to a solution including silanol condensate particles (a commercially available SOG solution), and the solution including silanol condensate particles is applied on a substrate so as to form a coating film. The coating film is then heat treated so as to thermally decompose the silyl groups chemically modifying the silanol condensate particles. Thus, a porous film is formed.

Since this method of forming a porous film utilizes a SOG process generally used in the manufacture of a semiconductor, it is superior to the aforementioned conventional methods in obtaining a porous film through a simple process.

In order to minimize the size of a pore included in a porous film to an extent required in an interlayer insulating film used in an LSI, it is necessary to add the silylation reagent to the solution including silanol condensate particles in the presence of, for example, amine. However, when amine is added to the solution including silanol condensate particles, there arises a problem that the property of the solution including silanol condensate particles (namely, the material for the porous film) is changed with time in a very short period of time.

SUMMARY OF THE INVENTION

In view of the aforementioned conventional problems, an object of the invention is providing a method, as simple as the conventional SOG process, of forming a porous film in a short period of time at a low temperature under atmospheric pressure, in which a material for the porous film can be prevented from degrading with time, and in which the diameter of a pore in the porous film can be minimized sufficiently for integration in an LSI so as to decrease the dielectric constant of the porous film.

In order to achieve the object, the first method of forming a porous film of this invention comprises the steps of forming a coating film by applying, on a substrate, an organic acid containing solution obtained by adding an organic acid having an alkyl group to a solution including silanol condensate particles; and forming a porous film from the coating film by conducting a heat treatment on the coating film.

In the first method of forming a porous film, the organic acid having an alkyl group is preferably propionic acid, acetic acid, butyric acid, isobutyric acid, isovaleric acid, valeric acid, 2-ethyl-n-butyric acid or trimethylacetic acid.

The second method of forming a porous film of this invention comprises the steps of forming a coating film by applying, on a substrate, an organic acid containing solution obtained by adding an organic acid having halogen to a solution including silanol condensate particles; and forming a porous film from the coating film by conducting a heat treatment on the coating film.

In the second method of forming a porous film, the organic acid having halogen is preferably chloroacetic acid, dichloroacetic acid, trichloroacetic acid, fluoroacetic acid, difluoroacetic acid or trifluoroacetic acid.

The third method of forming a porous film of this invention comprises the steps of forming a coating film by applying, on a substrate, an organic acid containing solution obtained by adding an organic acid having a hydroxyl group to a solution including silanol condensate particles; and forming a porous film from the coating film by conducting a heat treatment on the coating film.

The fourth method of forming a porous film of this invention comprises the steps of forming a coating film by applying, on a substrate, an organic acid containing solution obtained by adding two or more organic acids having hydroxyl groups to a solution including silanol condensate particles; and forming a porous film from the coating film by conducting a heat treatment on the coating film.

In the third or fourth method of forming a porous film, the organic acid having a hydroxyl group is preferably hydroxypropionic acid, hydroxyacetic acid, hydroxybutyric acid, hydroxyisobutyric acid or hydroxyisovaleric acid.

The fifth method of forming a porous film of this invention comprises the steps of forming a coating film by applying, on a substrate, an organic acid containing solution obtained by adding an organic acid having a polar group including carbon and a heteroatom to a solution including silanol condensate particles; and forming a porous film from the coating film by conducting a heat treatment on the coating film.

In the fifth method of forming a porous film, the organic acid having a polar group including carbon and a heteroatom is preferably methoxyacetic acid, β-acetopropionic acid, cyanoacetic acid, pyruvic acid or pivalic acid.

The sixth method of forming a porous film of this invention comprises the steps of forming a coating film by applying, on a substrate, an organic acid containing solution obtained by adding one or more organic acid having a hydroxyl group and one or more organic acid having a polar group including carbon and a heteroatom to a solution including silanol condensate particles; and forming a porous film from the coating film by conducting a heat treatment on the coating film.

In any of the first through sixth methods of forming a porous film, when the coating film is formed by applying, on the substrate, the organic acid containing solution obtained by adding the organic acid to the solution including silanol condensate particles, the organic acid included in the organic acid containing solution is incorporated into the coating film through a weak bonding between silanol remaining in the silanol condensate particles and hydroxyl group of acid as is shown in FIG. 1(a). Next, as is shown in FIG. 1(b), the organic acid incorporated into the coating film is concentrated into a higher concentration as the coating film is more dried, and condensation (gelation) of the silanol condensate particles through a reaction with a moisture component in the air catalytically proceeds. Also, as the solvent included in the organic acid containing solution is evaporated, pores are formed in the coating film. In this case, since the silanol condensate particles are condensed, the coating film attains a strength sufficiently high for resisting against shrinkage of the wall of the pore (minimization of the pore). Therefore, although the pores are fined, the pores can remain without collapsing.

When the coating film is subsequently heated, the organic acid incorporated into the coating film is vaporized to be externally released out of the coating film as is shown in FIG. 1(c). Thus, additional pores are further formed in the coating film in accordance with the release of the organic acid. The dielectric constant of the porous film depends upon the volume percentage of the organic acid included in the coating film. This is because pores (holes) corresponding to the volume of the organic acid are present in the coating film and such a pore has a very small dielectric constant of approximately 1, and hence, the dielectric constant of the coating film is decreased in accordance with increase of the volume percentage of the pores.

In any of the first through sixth methods of forming a porous film, the coating film is formed by applying, on the substrate, the organic acid containing solution obtained by adding the organic acid to the solution including silanol condensate particles. Therefore, the organic acid included in the organic acid containing solution is incorporated into the coating film through the weak bonding between silanol remaining in the silanol condensate particles and hydroxyl group of organic acid. The organic acid incorporated into the coating film catalytically promotes the condensation of the silanol condensate particles, so as to improve the strength of the coating film. Accordingly, the pores formed in accordance with the evaporation of the solvent from the coating film can remain without collapsing.

Also, the organic acid is vaporized by heating the coating film, and the additional pores are further formed in the coating film as the organic acid is vaporized. Accordingly, the dielectric constant of the porous film can be decreased.

In particular in the third method of forming a porous film, the organic acid includes a hydroxyl group, and hence, the applied solution is hydrophillic. Therefore, the applied solution has high wettability against the substrate to be satisfactorily applied thereon. Furthermore, since a large number of hydroxyl groups of the organic acid are present in the surfaces of the silanol condensate particles, hydrogen bonds of the hydroxyl groups are formed in forming the coating film, and the coating film almost loses flowability immediately after applying the organic acid containing solution. As a result, the coating film can be easily made porous.

Moreover, in the fourth method of forming a porous film, the organic acids include hydroxyl groups, and hence, the applied solution is hydrophillic. Therefore, the applied solution has high wettability against the substrate to be satisfactorily applied thereon. In addition, since the organic acids include two kinds of hydroxyl groups, the coating film can be more easily made porous and the pores can be more easily minimized in the diameter.

Furthermore, in the fifth method of forming a porous film, the organic acid includes a polar group, and hence, the applied solution is hydrophillic. Therefore, the applied solution has high wettability against the substrate to be satisfactorily applied thereon. In addition, a large number of polar groups of the organic acid are present in the surfaces of the silanol condensate particles, hydrogen bonds of hydroxyl groups are formed in forming the coating film, and the coating film almost loses flowability immediately after applying the organic acid containing solution. As a result, the coating film can be easily made porous.

Also, in the sixth method of forming a porous film, the organic acids include a hydroxyl group and a polar group, and hence, the applied solution is hydrophillic. Therefore, the applied solution has high wettability against the substrate to be more satisfactorily applied thereon. In addition, a large number of hydroxyl groups and polar groups are present in the surfaces of the silanol condensate particles, hydrogen bonds of the hydroxyl groups are formed in forming the coating film, and the coating film almost loses flowability immediately after applying the organic acid containing solution. As a result, the coating film is more easily made porous.

In any of the first through sixth methods of forming a porous film, the organic acid preferably has an acid dissociation constant of 5 or less. In this manner, the life of the organic acid containing solution can be prevented from decreasing.

Any of the first through sixth methods of forming a porous film preferably further comprises, between the step of forming the coating film and the step of forming the porous film, a step of polymerizing the silanol condensate particles included in the coating film by supplying steam to the coating film.

When steam is supplied onto the coating film in this manner, the polymerization of the silanol condensate particles included in the coating film is accelerated, resulting in rapidly increasing the strength of the coating film. Accordingly, the pores formed in the coating film in accordance with the evaporation of the solvent can be definitely prevented from collapsing.

In any of the first through sixth methods of forming a porous film, the step of forming the coating film preferably includes a step of applying the organic acid containing solution on the substrate, while the silanol condensate particles included in the organic acid containing solution are being polymerized by supplying steam to the organic acid containing solution.

When the coating film is formed with supplying steam to the organic acid containing solution in this manner, the polymerization of the silanol condensate particles included in the organic acid containing solution is accelerated, resulting in rapidly increasing the strength of the coating film. Accordingly, the pores formed in the coating film in accordance with the evaporation of the solvent can be definitely prevented from collapsing.

The seventh method of forming a porous film of this invention comprises the steps of forming a coating film by applying, on a substrate, an acid anhydride containing solution obtained by adding an acid anhydride of an organic acid to a solution including silanol condensate particles; and forming a porous film from the coating film by conducting a heat treatment on the coating film.

In the seventh method of forming a porous film, when the coating film is formed by applying, on the substrate, the acid anhydride containing solution obtained by adding the acid anhydride of an organic acid to the solution including silanol condensate particles, the acid anhydride of an organic acid included in the acid anhydride containing solution is incorporated into the coating film through weak bonding between silanol remaining in the silanol condensate particles and hydroxyl group of organic acid. Then, the acid anhydride of an organic acid incorporated into the coating film is changed into the organic acid through a reaction with a moisture component in the air. The thus produced organic acid is concentrated into a higher concentration as the coating film is more dried, and the condensation (gelation) of the silanol condensate particles through a reaction with a moisture component in the air catalytically proceeds. Also, pores are formed in the coating film in accordance with evaporation of the solvent included in the acid anhydride containing solution. In this case, since the silanol condensate particles are condensed, the coating film attains high strength sufficient for resisting against the shrinkage of the peripheral wall of a pore (minimization of a pore). Therefore, the pores can remain without collapsing even through they are minimized in the diameter.

When the coating film is subsequently heated, the organic acid incorporated into the coating film is vaporized to be externally released out of the coating film. Thus, additional pores are further formed in the coating film by the release of the organic acid. The dielectric constant of the porous film depends upon the volume percentage of the organic acid included in the coating film. This is because pores (holes) corresponding to the volume of the organic acid are present in the coating film and such a pore has a very small dielectric constant of approximately 1, and hence, the dielectric constant of the coating film is decreased in accordance with increase of the volume percentage of the pores.

In the seventh method of forming a porous film, the coating film is formed by applying, on the substrate, the acid anhydride containing solution obtained by adding the acid anhydride of an organic acid to the solution including silanol condensate particles. Therefore, the acid anhydride scarcely generates protons in the acid anhydride containing solution before the application to the substrate, and hence, the silanol condensate particles are difficult to polymerize. Therefore, the life of the material for a porous film can be elongated. When the acid anhydride containing solution is applied on the substrate, the acid anhydride of an organic acid is changed into the organic acid through the reaction with the moisture component in the air, and the organic acid is concentrated into a higher concentration as the coating film is more dried, and catalytically proceeds the condensation of the silanol condensate particles through the reaction with the moisture component in the air.

Also, the organic acid is vaporized by heating the coating film, and additional pores are further formed in the coating film in accordance with the vaporization of the organic acid. Therefore, the dielectric constant of the porous film can be decreased.

In the seventh method of forming a porous film, the acid anhydride of an organic acid is preferably an acid anhydride of propionic acid, acetic acid, butyric acid, isobutyric acid, isovaleric acid, valeric acid, 2-ethyl-n-butyric acid, trimethylacetic acid, chloroacetic acid, dichloroacetic acid, trichloroacetic acid, fluoroacetic acid, difluoroacetic acid, trifluoroacetic acid, hydroxypropionic acid, hydroxyacetic acid, hydroxybutyric acid, hydroxyisobutyric acid, hydroxyisovaleric acid, methoxyacetic acid, β-acetopropionic acid, cyanoacetic acid, pyruvic acid or pivalic acid.

In the seventh method of forming a porous film, the acid anhydride is preferably an acid anhydride of an organic acid having an acid dissociation constant of 5 or less. In this manner, the life of the acid anhydride containing solution is further elongated, resulting in largely elongating the life of the material for forming a porous film.

The seventh method of forming a porous film preferably further comprises, between the step of forming the coating film and the step of forming the porous film, a step of polymerizing the silanol condensate particles included in the coating film by supplying steam to the coating film.

When the coating film is supplied with steam in this manner, the polymerization of the silanol condensate particles included in the coating film is accelerated, so as to rapidly increase the strength of the coating film. Therefore, the pores formed in the coating film in accordance with the evaporation of the solvent can be definitely prevented from collapsing.

In the seventh method of forming a porous film, the step of forming the coating film preferably includes a step of applying the acid anhydride containing solution on the substrate, while the silanol condensate particles included in the acid anhydride containing solution are being polymerized by supplying steam to the acid anhydride containing solution.

When the coating film is formed with supplying steam to the acid anhydride containing solution in this manner, the polymerization of the silanol condensate particles included in the coating film is accelerated, so as to rapidly increase the strength of the coating film. Therefore, the pores formed in the coating film in accordance with the evaporation of the solvent can be definitely prevented from collapsing.

As described so far, according to the first through seventh methods of forming a porous film of this invention, the solution including silanol condensate particles is difficult to degrade with time and a porous film can be formed by a method as simple as the conventional SOG process in a short period of time at a low temperature under atmospheric pressure. Moreover, the pores included in the porous film are sufficiently fine for integration in an LSI, and hence, the dielectric constant of the porous film can be decreased.

The first material for forming a porous film of this invention comprises an organic acid containing solution obtained by adding an organic acid having an alkyl group to a solution including silanol condensate particles.

By using the first material for forming a porous film, the first method of forming a porous film can be easily and definitely conducted.

The second material for forming a porous film of this invention comprises an organic acid containing solution obtained by adding an organic acid having halogen to a solution including silanol condensate particles.

By using the second material for forming a porous film, the second method of forming a porous film can be easily and definitely conducted.

The third material for forming a porous film of this invention comprises an organic acid containing solution obtained by adding an organic acid having a hydroxyl group to a solution including silanol condensate particles.

By using the third material for forming a porous film, the third method of forming a porous film can be easily and definitely conducted.

The fourth material for forming a porous film of this invention comprises an organic acid containing solution obtained by adding two or more organic acids having hydroxyl groups to a solution including silanol condensate particles.

By using the fourth material for forming a porous film, the fourth method of forming a porous film can be easily and definitely conducted.

The fifth material for forming a porous film of this invention comprises an organic acid containing solution obtained by adding an organic acid having a polar group including carbon and a heteroatom to a solution including silanol condensate particles.

By using the fifth material for forming a porous film, the fifth method of forming a porous film can be easily and definitely conducted.

The sixth material for forming a porous film of this invention comprises an organic acid containing solution obtained by adding one or more organic acid having a hydroxyl group and one or more organic acid having a polar group including carbon and a heteroatom to a solution including silanol condensate particles.

By using the sixth material for forming a porous film, the sixth method of forming a porous film can be easily and definitely conducted.

The seventh material for forming a porous film of this invention comprises an acid anhydride containing solution obtained by adding an acid anhydride of an organic acid to a solution including silanol condensate particles.

By using the seventh material for forming a porous film, the seventh method of forming a porous film can be easily and definitely conducted.

DETAILED DESCRIPTION OF THE INVENTION

Embodiment 1

Figure 1:
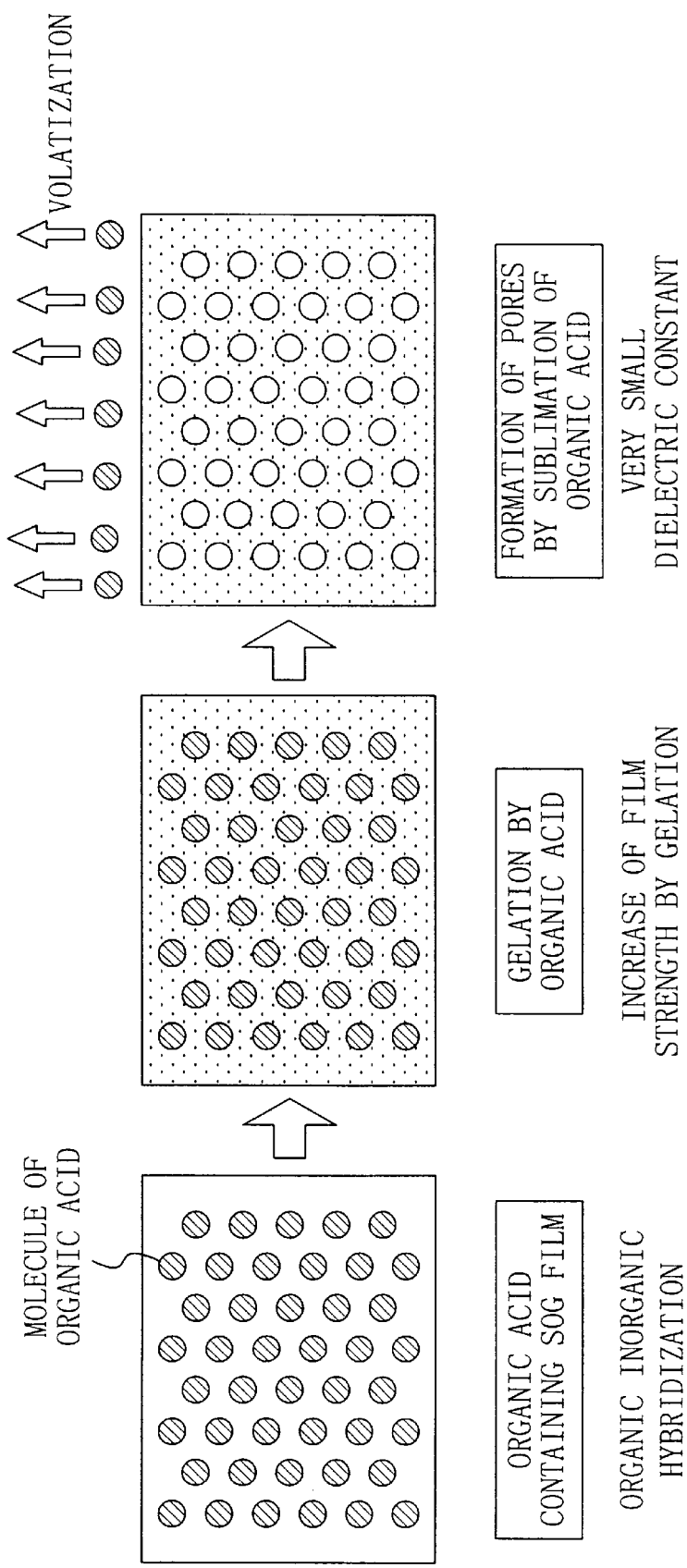
FIGS. 1(a), 1(b), and 1(c) are conceptual diagrams for illustrating the mechanism of forming a porous film from an organic acid containing solution.
Figure 2:
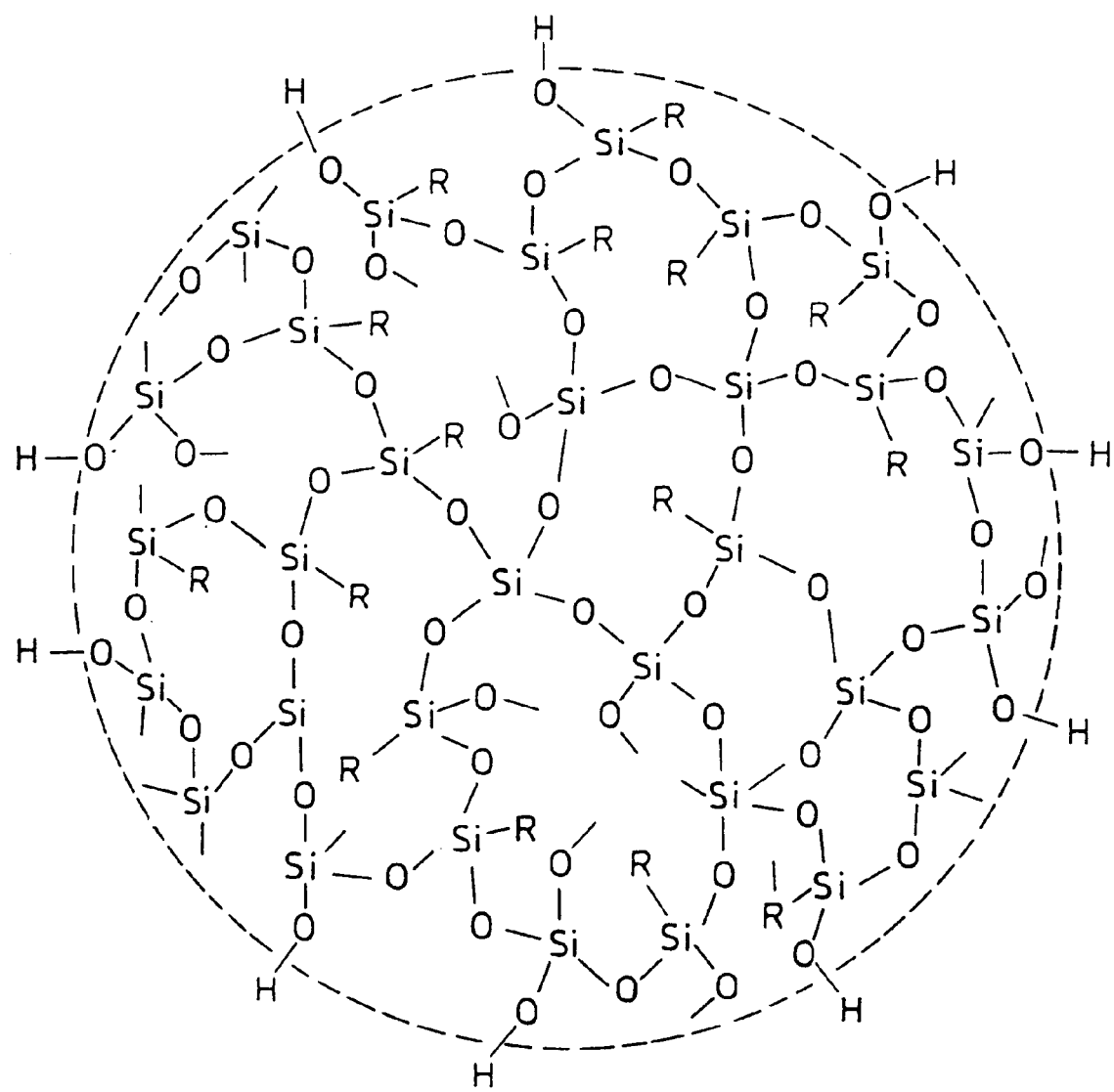
FIG. 2 is a schematic diagram of a silanol condensate particle.

An organic acid containing solution obtained by adding 3 ml of butyric acid, serving as an organic acid having an alkyl group, to 5 ml of a solution including silanol condensate particles (whose schematic structure is shown in FIG. 2) at a concentration of 10 wt % in terms of $SiO_2$ (a commercially available SOG solution) is stirred for approximately 10 minutes. The resultant organic acid containing solution is dropped on a silicon substrate through a 0.2 $\mu$m filter, and rotational coating is conducted at 4000 r.p.m. for 20 seconds. Thus, a coating film is formed. In this manner, butyric acid added to the solution is volatized during the rotational coating, so that the coating film becomes porous in accordance with the volatization of butyric acid.

The butyric acid incorporated into the coating film is concentrated into a higher concentration as the coating film is more dried, and reacts with a moisture component in the air so as to catalytically proceed condensation (gelation) of the silanol condensate particles. Through the condensation of the silanol condensate particles, the coating film attains a high strength sufficient for resisting against shrinkage due to a surface tension of the peripheral wall of a pore formed in the coating film in accordance with evaporation of the solvent. As a result, the pores in the coating film can remain without collapsing in spite of the evaporation of the solvent.

Next, the coating film is baked by using a hot plate at a temperature of 160° C. for 3 minutes, and is then heat treated by using an electric furnace in an atmosphere of nitrogen at a temperature of 400° C. for 30 minutes. Through this baking and heat treatment, the organic acid incorporated into the coating film is vaporized to be externally released, and pores are additionally formed in the coating film in accordance with the release of the organic acid. In other words, since the molecules of the organic acid incorporated into the coating film work as molds for pores, pores homogeneously dispersed in the coating film can be formed.

Formation of the porous film is confirmed through observation with an SEM of the surface of the coating film after the heat treatment.

The thickness of the porous film measured with the SEM is 154 nm. Also, the dielectric constant of the porous film attained after the heat treatment is found to be 2.2 through a CV method at 1 MHz. In addition, it is confirmed through observation with the SEM of the section of the porous film that the pores are fined with a diameter of several nm or less.

When dehydrogenation condensation of $CH_3$—$Si(OH)_3$ and $Si(OH)_4$ or dehydrogenation condensation of H—Si$(OH)_3$ and $Si(OH)_4$ is used as the silanol condensation, a porous film with less hygroscopicity can be formed. Since such silanol condensation have a low polymerization rate, the condensation scarcely proceeds in the presence of a small amount of an acid catalyst. However, when a large amount of organic acid is added to the solution of the silanol condensate particles as described above, the condensation reaction can be completed in a short period of time sufficient for practical use.

As the organic acid having an alkyl group, butyric acid can be replaced with any of propionic acid, acetic acid, isobutyric acid, isovaleric acid, valeric acid, 2-ethyl-n-butyric acid and trimethylacetic acid.

Embodiment 2

An organic acid containing solution obtained by adding 700 mg of dichloroacetic acid, serving as an organic acid having halogen, to 5 ml of a solution including silanol condensate particles (whose schematic structure is shown in FIG. 2) at a concentration of 10 wt % in terms of $SiO_2$ (a commercially available SOG solution) is stirred for approximately 10 minutes. The resultant organic acid containing solution is dropped on a silicon substrate through a 0.2 $\mu$m filter, and the rotational coating is conducted at 4000 r.p.m. for 20 seconds. Thus, a coating film is formed. In this manner, dichloroacetic acid added to the solution is volatized during the rotational coating, so that the coating film becomes porous in accordance with the volatization of dichloroacetic acid.

It is confirmed with the infrared absorption spectrum that dichloroacetic acid is incorporated into the coating film. The dichloroacetic acid incorporated into the coating film is concentrated into a higher concentration as the coating film is more dried, and reacts with a moisture component in the air so as to catalytically proceed condensation (gelation) of the silanol condensate particles. Through the condensation of the silanol condensate particles, the coating film attains a high strength sufficient for resisting against shrinkage due to a surface tension of the peripheral wall of a pore formed in the coating film in accordance with the evaporation of the solvent. As a result, the pores in the coating film can remain without collapsing in spite of the evaporation of the solvent.

Next, the coating film is baked by using a hot plate at a temperature of 160° C. for 3 minutes, and is then heat treated by using an electric furnace in an atmosphere of nitrogen at a temperature of 400° C. for 30 minutes. Through this baking and heat treatment, the organic acid incorporated into the coating film is vaporized to be externally released, and pores are additionally formed in the coating film in accordance with the release of the organic acid.

It is confirmed with the infrared absorption spectrum that an absorption peak derived from a carbonyl group of dichloroacetic acid has disappeared after the baking.

Formation of the porous film is confirmed through observation with an SEM of the surface of the coating film after the heat treatment.

The thickness of the porous film measured with the SEM is 154 nm. Also, the dielectric constant of the porous film attained after the heat treatment is found to be 2.1 through the CV method at 1 MHz. In addition, it is confirmed through observation with the SEM of the section of the porous film that the pores are fined with a diameter of several nm or less.

When dehydrogenation condensation of $CH_3$—$Si(OH)_3$ and $Si(OH)_4$ or dehydrogenation condensation of H—Si$(OH)_3$ and $Si(OH)_4$ is used as the silanol condensation, a porous film with less hygroscopicity can be formed. Similarly to Embodiment 1, when a large amount of organic acid is added to the solution of the silanol condensate particles, the condensation reaction can be completed in a short period of time sufficient for practical use.

As the organic acid having halogen, dichloroacetic acid can be replaced with any of chloroacetic acid, trichloroacetic acid, fluoroacetic acid, difluoroacetic acid and trifluoroacetic acid.

Embodiment 3

An organic acid containing solution obtained by adding 1 ml of lactic acid, serving as an organic acid having a hydroxyl group, to 5 ml of a solution including silanol condensate particles (whose schematic structure is shown in FIG. 2) at a concentration of 10 wt % in terms of $SiO_2$ (a commercially available SOG solution) is stirred for approximately 10 minutes. The resultant organic acid containing solution is dropped on a silicon substrate through a 0.2 $\mu$m filter, and the rotational coating is conducted at 4000 r.p.m. for 20 seconds. Thus, a coating film is formed.

Lactic acid is highly efficiently incorporated into the coating film owing to its high boiling point. The lactic acid incorporated into the coating film is concentrated into a higher concentration as the coating film is more dried, and reacts with a moisture component in the air so as to catalytically proceed condensation (gelation) of the silanol condensate particles. Through the condensation of the silanol condensate particles, the coating film attains a high strength sufficient for resisting against shrinkage due to a surface tension of the peripheral wall of a pore formed in the coating film in accordance with the evaporation of the solvent. As a result, the pores in the coating film can remain without collapsing in spite of the evaporation of the solvent.

Also, since lactic acid includes a hydroxyl group, the applied solution is hydrophilic. Therefore, the applied solution has high wettability against the silicon substrate to be satisfactorily applied thereon.

Furthermore, since a large number of hydroxyl groups of lactic acid are present in the surfaces of the silanol condensate particles modified by lactic acid, hydrogen bonds between the hydroxyl groups are formed in forming the coating film. Therefore, the coating film almost loses flowability immediately after the application of the organic acid containing solution. Accordingly, even when merely a small amount of organic acid is added, the resultant coating film can be more easily made porous as compared with the case where an organic acid having no hydroxyl group is used.

Next, the coating film is baked by using a hot plate at a temperature of 160° C. for 3 minutes, and is then heat treated by using an electric furnace in an atmosphere of nitrogen at a temperature of 400° C. for 30 minutes. Through this baking and heat treatment, the organic acid incorporated into the coating film is vaporized to be externally released, and pores are additionally formed in the coating film in accordance with the release of the organic acid.

Formation of the porous film is confirmed through observation with an SEM of the surface of the coating film after the heat treatment.

The thickness of the porous film measured with the SEM is 250 nm. Also, the dielectric constant of the porous film attained after the heat treatment is found to be 2.2 through the CV method at 1 MHz. In addition, it is confirmed through observation with the SEM of the section of the porous film that the pores are fined with a diameter of approximately several tens nm or less.

When the organic acid having a hydroxyl group is used, the resultant film can be advantageously easily made porous, while the pores formed therein disadvantageously have a slightly larger diameter.

When dehydrogenation condensation of $CH_3$—$Si(OH)_3$ and $Si(OH)_4$ or dehydrogenation condensation of H—Si (OH)$_3$ and Si(OH)$_4$ is used as the silanol condensation, a porous film with less hygroscopicity can be formed. Similarly to Embodiment 1, when a large amount of organic acid is added to the solution of the silanol condensate particles, the condensation reaction can be completed in a short period of time sufficient for practical use.

As the organic acid having a hydroxyl group, lactic acid can be replaced with any of hydroxypropionic acid, hydroxyacetic acid, hydroxybutyric acid, hydroxyisobutyric acid and hydroxyisovaleric acid.

Embodiment 4

An organic acid containing solution obtained by adding 1 ml of lactic acid and 500 mg of hydroxyacetic acid, serving as two organic acids having alkyl groups, to 5 ml of a solution including silanol condensate particles (whose schematic structure is shown in FIG. 2) at a concentration of 10 wt % in terms of SiO$_2$ (a commercially available SOG solution) is stirred for approximately 10 minutes. The resultant organic acid containing solution is dropped on a silicon substrate through a 0.2 $\mu$m filter, and the rotational coating is conducted at 4000 r.p.m. for 20 seconds. Thus, a coating film is formed. In this manner, the organic acids added to the solution are volatized during the rotational coating, so that the coating film becomes porous in accordance with the volatization of the organic acids.

It is confirmed with the infrared absorption spectrum that the two organic acids are incorporated into the coating film. The two organic acids incorporated into the coating film are concentrated into a higher concentration as the coating film is more dried, and react with a moisture component in the air so as to catalytically proceed condensation (gelation) of the silanol condensate particles. Through the condensation of the silanol condensate particles, the coating film attains a high strength sufficient for resisting against shrinkage due to a surface tension of the wall of a pore formed in the coating film in accordance with the evaporation of the solvent. As a result, the pores in the coating film can remain without collapsing in spite of the evaporation of the solvent.

Since hydroxyacetic acid includes a carbonyl group with a polarity and lactic acid includes a hydroxyl group with a polarity, the applied solution is hydrophilic. Therefore, the applied solution has high wettability against the silicon substrate to be satisfactorily applied thereon.

It is confirmed through observation of darkfield with an optical microscope that when two or more organic acids having hydroxyl groups are added to the solution including silanol condensate particles in this manner, the diameter of the pores formed in the porous film can be minimized. The diameter of the pores is thus minimized probably because the regularity in the alignment of the silanol condensate particles in the coating film is spoiled due to plural hydrogen bonds having different shapes formed among the silanol condensate particles.

Next, the coating film is baked by using a hot plate at a temperature of 160° C. for 3 minutes, and is then heat treated by using an electric furnace in an atmosphere of nitrogen at a temperature of 400° C. for 30 minutes. Through this baking and heat treatment, the organic acids incorporated into the coating film are vaporized to be externally released, and additional pores are formed in the coating film in accordance with the release of the organic acid.

It is confirmed with the infrared absorption spectrum that an absorption peak derived from the carbonyl group of the organic acid has disappeared after the baking.

Formation of the porous film is confirmed through observation with an SEM of the surface of the coating film after the heat treatment.

The thickness of the porous film measured with the SEM is 230 nm. Also, the dielectric constant of the porous film attained after the heat treatment is found to be 2.2 through the CV method at 1 MHz. In addition, it is confirmed through observation with the SEM of the section of the porous film that the pores are fined with a diameter of several nm or less.

When an organic acid having a hydroxyl group is used as in Embodiment 3, the diameter of the pores in the resultant porous film is disadvantageously increased as described above. However, when two or more organic acids having hydroxyl groups are added to the solution including silanol condensate particles as in Embodiment 4, the diameter of the pores in the porous film can be minimized.

When dehydrogenation condensation of CH$_3$—Si(OH)$_3$ and Si(OH)$_4$ or dehydrogenation condensation of H—Si(OH)$_3$ and Si(OH)$_4$ is used as the silanol condensation, a porous film with less hygroscopicity can be formed. Similarly to Embodiment 1, when a large amount of organic acid is added to the solution of the silanol condensate particles, the condensation reaction can be completed in a short period of time sufficient for practical use.

As the organic acids having hydroxyl groups, lactic acid and hydroxyacetic acid can be replaced with any of hydroxypropionic acid, hydroxybutyric acid, hydroxyisobutyric acid and hydroxyisovaleric acid.

Embodiment 5

An organic acid containing solution obtained by adding 1 ml of pyruvic acid, serving as an organic acid having a polar group including carbon and a heteroatom (such as a carbonyl group), to 5 ml of a solution including silanol condensate particles (whose schematic structure is shown in FIG. 2) at a concentration of 10 wt % in terms of SiO$_2$ is stirred for approximately 10 minutes. The resultant organic acid containing solution is dropped on a silicon substrate through a 0.2 $\mu$m filter, and the rotational coating is conducted at 4000 r.p.m. for 20 seconds. Thus, a coating film is formed.

Pyruvic acid is highly efficiently incorporated into the coating film owing to its high boiling point. The pyruvic acid incorporated into the coating film is concentrated into a higher concentration as the coating film is more dried, and reacts with a moisture component in the air so as to catalytically proceed condensation (gelation) of the silanol condensate particles. Through the condensation of the silanol condensate particles, the coating film attains a high strength sufficient for resisting against shrinkage due to a surface tension of the peripheral wall of a pore formed in the coating film in accordance with the evaporation of the solvent. As a result, the pores in the coating film can remain without collapsing in spite of the evaporation of the solvent.

Also, since pyruvic acid includes a carbonyl group with a polarity, the applied solution is hydrophillic. Therefore, the applied solution has high wettability against the silicon substrate to be satisfactorily applied thereon.

Furthermore, since a large number of carbonyl groups of pyruvic acid are present in the surfaces of the silanol condensate particles modified by pyruvic acid, hydrogen bonds between the carbonyl groups and the hydroxyl groups of silanol are formed in forming the coating film. Therefore, the coating film almost loses flowability immediately after the application of the organic acid containing solution. Accordingly, even when merely a small amount of the organic acid is added, the resultant coating film can be more easily made porous as compared with the case where an organic acid having no hydroxyl group is used.

Next, the coating film is baked by using a hot plate at a temperature of 160° C. for 3 minutes, and is then heat treated by using an electric furnace in an atmosphere of nitrogen at a temperature of 400° C. for 30 minutes. Through this baking and heat treatment, the organic acid incorporated into the coating film is vaporized to be externally released, and additional pores are formed in the coating film in accordance with the release of the organic acid.

Formation of the porous film is confirmed through observation with an SEM of the surface of the coating film after the heat treatment.

The thickness of the porous film measured with the SEM is 280 nm. Also, the dielectric constant of the porous film attained after the heat treatment is found to be 2.3 through the CV method at 1 MHz. In addition, it is confirmed through observation with the SEM of the section of the porous film that the pores are fined with a diameter of several nm or less.

When an organic acid having a carbonyl group is used, pores can be easily formed and the diameter of the pores can be minimized differently from the case where an organic acid having a hydroxyl group is used.

When dehydrogenation condensation of $CH_3$—$Si(OH)_3$ and $Si(OH)_4$ or dehydrogenation condensation of H—$Si(OH)_3$ and $Si(OH)_4$ is used as the silanol condensation, a porous film with less hygroscopicity can be formed. Similarly to Embodiment 1, when a large amount of organic acid is added to the solution of the silanol condensate particles, the condensation reaction can be completed in a short period of time sufficient for practical use.

As the organic acid having a polar group including carbon and a heteroatom, pyruvic acid can be replaced with any of methoxyacetic acid, β-acetopropionic acid, cyanoacetic acid and pivalic acid.

Embodiment 6

An organic acid containing solution obtained by adding 0.5 ml of lactic acid, serving as an organic acid having a hydroxyl group, and 1 ml of pyruvic acid, serving as an organic acid including carbon and a heteroatom, to 5 ml of a solution including silanol condensate particles (whose schematic structure is shown in FIG. 2) at a concentration of 10 wt % in terms of $SiO_2$ is stirred for approximately 10 minutes. The resultant organic acid containing solution is dropped on a silicon substrate through a 0.2 μm filter, and the rotational coating is conducted at 4000 r.p.m. for 20 seconds. Thus, a coating film is formed. In this manner, the organic acids added to the solution are volatized during the rotational coating, so that the coating film becomes porous in accordance with the volatization of the organic acids.

It is confirmed with the infrared absorption spectrum that the two organic acids are incorporated into the coating film. The two organic acids incorporated into the coating film are concentrated into a higher concentration as the coating film is more dried, and react with a moisture component in the air so as to catalytically proceed condensation (gelation) of the silanol condensate particles. Through the condensation of the silanol condensate particles, the coating film attains a high strength sufficient for resisting against shrinkage due to a surface tension of the peripheral wall of a pore formed in the coating film in accordance with the evaporation of the solvent. As a result, the pores in the coating film can remain without collapsing in spite of the evaporation of the solvent.

Since pyruvic acid includes a carbonyl group with a polarity and lactic acid includes a hydroxyl group with a polarity, the applied solution is hydrophilic. Therefore, the applied solution has high wettability against the silicon substrate to be satisfactorily applied thereon.

Also, since a large number of carbonyl groups of pyruvic acid and a large number of hydroxyl groups of lactic acid are present in the surfaces of the silanol condensate particles modified by pyruvic acid and lactic acid, hydrogen bonds between the carbonyl groups and the hydroxyl groups are formed in forming the coating film. Therefore, the coating film almost loses flowability immediately after the application of the organic acid containing solution. Accordingly, even when small amounts of the organic acids are added, pores can be easily formed and the coating film can be formed in a larger thickness.

Next, the coating film is baked by using a hot plate at a temperature of 160° C. for 3 minutes, and is then heat treated by using an electric furnace in an atmosphere of nitrogen at a temperature of 400° C. for 30 minutes. Through this baking and heat treatment, the organic acids incorporated into the coating film are vaporized to be externally released, and additional pores are formed in the coating film in accordance with the release of the organic acid.

Formation of the porous film is confirmed through observation with an SEM of the surface of the coating film after the heat treatment.

The thickness of the porous film measured with the SEM is 260 nm. Also, the dielectric constant of the porous film attained after the heat treatment is found to be 2.1 through the CV method at 1 MHz. In addition, it is confirmed through observation with the SEM of the section of the porous film that the pores are fined with a diameter of several nm or less.

Embodiment 7

An acid anhydride containing solution obtained by adding an acid anhydride of an organic acid to a solution including silanol condensate particles (whose schematic structure is shown in FIG. 2) (a commercially available SOG solution) is stirred for approximately 10 minutes. The resultant acid anhydride containing solution is dropped on a silicon substrate through a 0.2 μm filter, and the rotational coating is conducted at 4000 r.p.m. for 20 seconds. Thus, a coating film is formed.

As described in Embodiments 1 through 6, the formation of a porous film with a small dielectric constant can be eased by adding an organic acid to a solution including silanol condensate particles. However, the organic acid containing solution obtained by adding an organic acid disadvantageously has a short life. The life of the organic acid containing solution herein means a time duration in which the thickness of the resultant coating film is increased by 10% or more as a result of the condensation of silanol proceeded in the organic acid containing solution.

However, when an acid anhydride containing solution obtained by adding an acid anhydride of an organic acid to a solution including silanol condensate particles is used as in Embodiment 7, polymerization of the silanol condensate particles is difficult to occur because the acid anhydride of an organic acid scarcely produces protons in the absence of water. Accordingly, use of the acid anhydride of an organic acid can largely decrease a rate of gelation at which the solution including the silanol condensate particles is gelated with time upon storage. As a result, the storage life of the material for forming a porous film can be elongated.

Also, since an acid anhydride of an organic acid has a boiling point higher than the organic acid included in the acid anhydride, the acid anhydride is more difficult to evaporate than the organic acid, and hence is more easily incorporated into the coating film. An acid anhydride of acetic acid incorporated into a coating film is changed into acetic acid through a reaction with a moisture component in the air, and is concentrated into a high concentration so as to catalytically proceed condensation (gelation) of the silanol condensate particles through the reaction with a moisture component in the air. Through the condensation of the silanol condensate particles, the coating film attains a high strength sufficient for resisting against shrinkage due to a surface tension of the peripheral wall of a pore formed in the coating film in accordance with the evaporation of the solvent. As a result, the pores in the coating film can remain without collapsing in spite of the evaporation of the solvent.

Next, the coating film is baked by using a hot plate at a temperature of 160° C. for 3 minutes, and is then heat treated by using an electric furnace in an atmosphere of nitrogen at a temperature of 400° C. for 30 minutes.

Formation of the porous film is confirmed through observation with an SEM of the surface of the coating film after the heat treatment.

The thickness of the porous film measured with the SEM is 210 nm. Also, the dielectric constant of the porous film attained after the heat treatment is found to be 2.3 through the CV method at 1 MHz.

When dehydrogenation condensation of $CH_3$—$Si(OH)_3$ and $Si(OH)_4$ or dehydrogenation condensation of H—Si$(OH)_3$ and $Si(OH)_4$ is used as the silanol condensation, a porous film with less hygroscopicity can be formed. Similarly to Embodiment 1, when a large amount of organic acid is added to the solution of the silanol condensate particles, the condensation reaction can be completed in a short period of time sufficient for practical use.

Examples of an acid anhydride of an organic acid to be used include acid anhydrides of propionic acid, acetic acid, butyric acid, isobutyric acid, isovaleric acid, valeric acid, 2-ethyl-n-butyric acid, trimethylacetic acid, chloroacetic acid, dichloroacetic acid, trichloroacetic acid, fluoroacetic acid, difluoroacetic acid, trifluoroacetic acid, hydroxypropionic acid, hydroxyacetic acid, hydroxybutyric acid, hydroxyisobutyric acid, hydroxyisovaleric acid, methoxyacetic acid, β-acetopropionic acid, cyanoacetic acid, pyruvic acid and pivalic acid.

Embodiment 8

An acid anhydride containing solution obtained by adding an acid anhydride of an organic acid to a solution including silanol condensate particles is stirred for approximately 10 minutes. The resultant acid anhydride containing solution is dropped on a silicon substrate through a 0.2 μm filter, and the rotational coating is conducted at 4000 r.p.m. for 20 seconds. Thus, a coating film is formed. Then, the coating film is subjected to a steam treatment so as to polymerize the silanol condensate particles included in the coating film. The steam treatment is conducted by, for example, spraying steam generated by using ultrasonic waves or the like onto the coating film for approximately 20 seconds.

As described in Embodiment 7, the life of an acid anhydride containing solution can be remarkably elongated by using an acid anhydride of an organic acid. However, there arises another problem that gelation of the coating film is accelerated as the acid anhydride of an organic acid dissociates into protonic acid in the presence of water, and hence, the rate of gelation of the coating film is disadvantageously low under general humidity.

However, when the coating film is subjected to the steam treatment as in Embodiment 8, the steam is diffused into the coating film and proceeds the dissociation of the acid anhydride into the acid, so that the thus generated acid can accelerate the gelation of the coating film.

For example, in using a mixed solution obtained by adding 1 ml of an acid anhydride of acetic acid, the dielectric constant is 2.1, and thus, the dielectric constant is more largely decreased as compared with the case where acetic acid is added. Also, the life of the mixed solution including the acid anhydride of acetic acid is increased by three times or more as compared with that of a mixed solution obtained by adding acetic acid.

Embodiment 9

An acid anhydride containing solution obtained by adding an acid anhydride of an organic acid to a solution including silanol condensate particles is stirred for approximately 10 minutes. The resultant acid anhydride containing solution is dropped on a silicon substrate through a 0.2 μm filter in an atmosphere of steam, and the rotational coating is conducted at 4000 r.p.m. for 20 seconds. Thus, a coating film is formed. When the acid anhydride containing solution is dropped with supplying steam, the coating film can be formed while the silanol condensate particles included in the acid anhydride containing solution are being polymerized. As a specific method of dropping the acid anhydride containing solution with supplying steam, for example, the acid anhydride containing solution is dropped on the silicon substrate in an atmosphere filled with steam by using ultrasonic waves.

As described in Embodiment 7, the life of the material for a porous film can be remarkably elongated by using an acid anhydride of an organic acid. As described in Embodiment 8, a practical rate of gelation can be obtained by supplying steam onto the coating film. In addition, when the acid anhydride containing solution is dropped on the silicon substrate in an atmosphere of steam as in Embodiment 9, water is dissolved in the acid anhydride containing solution, so that the water molecules can be homogeneously dissolved in the coating film. Accordingly, as compared with the case where the coating film is subjected to the steam treatment, the rate of gelation can be further increased and pores can be uniformly distributed in the coating film, although the diameter of the pores is increased.

Accordingly, the dielectric constant can be further decreased as compared with the case where the coating film is subjected to the steam treatment. For example, in using an acid anhydride containing solution obtained by adding 1 ml of an acid anhydride of acetic acid, the dielectric constant is 1.9, which is decreased by approximately 10% as compared with the case where the coating film is subjected to the steam treatment. However, the diameter of the pores seems to be increased by approximately twice as compared with the case where the coating film is subjected to the steam treatment.

The coating film formed from the acid anhydride containing solution is subjected to the steam treatment in Embodiment 8 and the coating film is formed by dropping the acid anhydride containing solution on the silicon substrate in an atmosphere of steam in Embodiment 9. Also in any of Embodiments 1 through 6, the coating film formed from the organic acid containing solution can be subjected to the steam treatment or the coating film can be formed by dropping the organic acid containing solution on the silicon substrate in an atmosphere of steam, so as to accelerate the polymerization of the silanol condensate particles.

What is claimed is:

1. A method of forming a porous film comprising the steps of:

forming a coating film by applying, on a substrate, an organic acid containing solution obtained by adding an organic acid having a polar group including carbon and a heteroatom to a solution including silanol condensate particles; and forming a porous film from said coating film by conducting a heat treatment on said coating film.

2. The method of forming a porous film of claim 1, wherein said organic acid having a polar group including carbon and a heteroatom is methoxyacetic acid, β-acetopropionic acid, cyanoacetic acid, pyruvic acid or pivalic acid.

3. The method of forming a porous film of claim 1, wherein said organic acid has an acid dissociation constant of 5 or less.

4. The method of forming a porous film of claim 1, further comprising, between said step of forming said coating film and said step of forming said porous film, a step of polymerizing said silanol condensate particles included in said coating film by supplying steam to said coating film.

5. A method of forming a porous film comprising the steps of:

forming a coating film by applying, on a substrate, an organic acid containing solution obtained by adding one or more organic acid having a hydroxyl group and one or more organic acid having a polar group including carbon and a heteroatom to a solution including silanol condensate particles; and forming a porous film from said coating film by conducting a heat treatment on said coating film. <

6. The method of forming a porous film of claim 5, wherein each of said organic acids has an acid dissociation constant of 5 or less.

7. The method of forming a porous film of claim 5, further comprising, between said step of forming said coating film and said step of forming said porous film, a step of polymerizing said silanol condensate particles included in said coating film by supplying steam to said coating film.

8. A method of forming a porous film comprising the steps of:

forming a coating film by applying, on a substrate, an acid anhydride containing solution obtained by adding an acid anhydride of an organic acid to a solution including silanol condensate particles; and forming a porous film from said coating film by conducting a heat treatment on said coating film;

wherein said acid anhydride of an organic acid is an acid anhydride of propionic acid, acetic acid, butyric acid, isobutyric acid, isovaleric acid, valeric acid, 2-ethyl-n-butyric acid, trimethylacetic acid, chloroacetic acid, dichloroacetic acid, trichloroacetic acid, fluoroacetic acid, difluoroacetic acid, trifluoroacetic acid, hydroxypropionic acid, hydroxyacetic acid, hydroxybutyric acid, hydroxyisobutyric acid, hydroxyisovaleric acid, methoxyacetic acid, acetopriopionic acid, cyanoacetic acid, pyruvic acid or pivalic acid.

9. The method of forming a porous film of claim 8, wherein said acid anhydride is an acid anhydride of an organic acid having an acid dissociation constant of 5 or less.

10. A method of forming a porous film comprising the steps of:

forming a coating film by applying, on a substrate, an acid anhydride containing solution obtained by adding an acid anhydride of an organic acid to a solution including silanol condensate particles;

forming a porous film from said coating film by conducting a heat treatment on said coating film; and between said step of forming said coating film and said step of forming said porous film, a step of polymerizing said silanol condensate particles included in said coating film by supplying steam to said coating film.

11. A method of forming a porous film comprising the steps of:

forming a coating film by applying, on a substrate, an acid anhydride containing solution obtained by adding an acid anhydride of an organic acid to a solution including silanol condensate particles; and forming a porous film from said coating film by conducting a heat treatment on said coating film;

wherein said step of forming said coating film includes a step of applying said acid anhydride containing solution on said substrate, while said silanol condensate particles included in said acid anhydride containing solution are being polymerized by supplying steam to said acid anhydride containing solution.

* * * * *

UNITED STATES PATENT AND TRADEMARK OFFICE
CERTIFICATE OF CORRECTION

PATENT NO.    : 6,194,029 B1
DATED         : February 27, 2001
INVENTOR(S)   : Nobou Aoi et al.

It is certified that error appears in the above-identified patent and that said Letters Patent is hereby corrected as shown below:

<u>Column 17,</u>
Line 31, delete claim 8, insert the following claim 8
-- 8. A method of forming a porous film comprising the steps of:
forming a coating film by applying, on a substrate, and acid
    anhydride containing solution obtained by adding an
    acid anhydride of an organic acid to a solution including
    silanol condensate particles; and
forming a porous film from said coating film by conducting
    a heat treatment on said coating film;
wherein said acid anhydride of an organic acid is an acid
    anhydride of propionic acid, acetic acid, butyric acid,
    isobutyric acid, isovaleric acid, valeric acid, 2-ethyl-n-
    butyric acid, trimethylacetic acid, chloroacetic acid,
    dichloroacetic acid, trichloroacetic acid, fluoroacetic
    acid, difluoroacetic acid, trifluoroacetic acid, hydrox-
    ypropionic acid, hydroxyacetic acid, hydroxybutyric
    acid, hydroxyisobutyric acid, hydroxyisovaleric acid,
    methoxyacetic acid, ß-acetopriopionic acid, cyanoacetic
    acid, pyruvic acid or pivalic acid. --

Signed and Sealed this

Third Day of December, 2002

JAMES E. ROGAN
*Director of the United States Patent and Trademark Office*